(12) United States Patent
Goff

(10) Patent No.: US 6,317,117 B1
(45) Date of Patent: Nov. 13, 2001

(54) USER INTERFACE FOR THE CONTROL OF AN AUDIO SPECTRUM FILTER PROCESSOR

(76) Inventor: Eugene Goff, 3443 Woodlands Cir., Macedon, NY (US) 14502

(*) Notice: Subject to any disclaimer, the term of this patent is extended or adjusted under 35 U.S.C. 154(b) by 0 days.

(21) Appl. No.: 09/250,946

(22) Filed: Feb. 16, 1999

Related U.S. Application Data

(60) Provisional application No. 60/101,512, filed on Sep. 23, 1998.

(51) Int. Cl.$^7$ .................................................. G09G 5/00
(52) U.S. Cl. ...................... 345/156; 345/168; 345/169; 345/172; 381/98; 381/104; 333/28 R; 333/28 T
(58) Field of Search ................................. 345/156, 168, 345/169, 172; 381/98, 99, 104, 105; 333/28 R, 28 T

(56) References Cited

U.S. PATENT DOCUMENTS

| D. 265,190 | 6/1982 | Bohanon, Sr. ........................... D13/3 |
| D. 288,921 | 3/1987 | Peck ....................................... D13/35 |
| D. 344,684 | 3/1994 | Metz et al. ........................... D10/103 |
| 4,285,065 | * 8/1981 | Priniski ................................. 455/158 |
| 5,182,796 | 1/1993 | Shibayama et al. ................. 395/156 |
| 5,374,924 | 12/1994 | McKiel, Jr. ...................... 340/825.19 |
| 5,572,443 | * 11/1996 | Emoto et al. ......................... 364/550 |

* cited by examiner

*Primary Examiner*—Bipin Shalwala
*Assistant Examiner*—Jimmy H. Nguyen
(74) *Attorney, Agent, or Firm*—Jaeckle Fleischmann & Mugel, LLP

(57) ABSTRACT

A user interface control apparatus is disclosed for the control of electronic filter parameters of audio spectrum equalizers, crossovers, and other filter processors. The user interface apparatus comprises five pushbutton keys arranged in a specific cross-shaped pattern. This single arrangement of control keys provides a common user interface control apparatus which can be used to control one or more filter types. Depression of particular keys, or particular combinations of keys can be made to electronically control multiple filter parameters, some simultaneously, and for different filter types depending on the filter type for which the invention is applied. The unique arrangement of the invention's pushbutton keys facilitates an intuitive operation of the various parameters for bell, notch, shelf, and pass-band audio filter types with a minimal number of control elements and minimal control area. The filter parameters of a bell filter that can be controlled include center frequency, amplitude, and bandwidth. The filter parameters of a notch filter that can be controlled include center frequency and bandwidth. The filter parameters of a shelf filter that can be controlled include transition frequency, shelf amplitude, and transition slope. The filter parameters of a pass-band filter that can be controlled include corner frequency, pass-band amplitude, and filter slope. Additionally, the unique arrangement of keys facilitates intuitive control of some filter parameters at two rates of continuous change. Also, the user interface allows control of a graphic equalizer, where the selection of a particular bell filter, or "band", can be scanned at two different rates. Finally, the user interface allows the control of the corner frequencies of two adjacent pass-band filters simultaneously, such as in a crossover processor, so as to preserve the combined response of the two filters over the overlapping region.

29 Claims, 22 Drawing Sheets

BELL FILTER

SHELF FILTER

NOTCH FILTER

PASS-BAND FILTER

FREQUENCY  BANDWIDTH/SLOPE  AMPLITUDE

USER INTERFACE FOR THE CONTROL OF AN AUDIO SPECTRUM FILTER PROCESSOR

This application claims the benefit of the priority date of Provisional Patent Application, Ser. No. 60/101,512, filed Sep. 23, 1998.

BACKGROUND OF THE INVENTION

This invention pertains to a user interface device which is designed to control multiple parameters of several electronic filter types commonly used in audio spectrum processors. The filter types which can be controlled by the invention include bell filters, notch filters, shelving filters, and pass-band filters. These filter types are employed in commercial products such as parametric equalizers, graphic equalizers, paragraphic equalizers, notch equalizers, shelving equalizers, and frequency-dividing crossover units.

Bell Filter. A bell filter is a filter type which amplifies or attenuates the signal amplitude over a limited frequency band or region. In general, a bell filter has three parameters which can be controlled. The first parameter which can be controlled is the center frequency of the filter. The second parameter which can be controlled is the bandwidth of the filter. Alternatively, the filter quality factor, or "Q" can be controlled which is the same as controlling the bandwidth in an inverse relationship, where Q and bandwidth are related by:

$$Q = \text{center frequency} / \text{bandwidth} \quad (1)$$

The third parameter which can be controlled is the amplitude at the center of the filter region. An amplitude control is also commonly called a "gain", "level", or "boost/cut" control, where a "boost" setting corresponds to an increased amplitude over the filter region and a "cut" setting corresponds to a decreased amplitude over the filter region. Bell filters are commonly employed in commercial products such as graphic equalizers, para-graphic equalizers, and parametric equalizers, where one, two, or all three of the parameters described may be controlled.

Notch Filter. A notch filter is a filter type which attenuates the signal over a limited frequency band or region and attenuates the signal to zero amplitude at the center of the attenuation region of the filter. In general, a notch filter has two parameters which can be controlled. The first parameter which can be controlled is the center frequency of the filter. The second parameter which can be controlled is the bandwidth of the filter. Alternatively, the filter Q can be controlled which is the same as controlling the bandwidth in an inverse relationship, where Q and bandwidth are related by equation (1). Notch filters are commonly employed in commercial equalizer products, where one or two of the parameters described may be controlled.

Shelf Filter. A shelf filter is a filter type which amplifies or attenuates the signal amplitude by a constant factor over a defined frequency region. In general, a shelf filter has three parameters which can be controlled. The first parameter which can be controlled is the transition frequency of the filter from one constant amplitude region, or "plateau" to an adjacent plateau region. The transition frequency may be defined as the frequency at which the amplitude is 3 dB different from the amplitude in one or the other plateau region, or the transition frequency may be defined as the frequency half-way between the two plateau regions of which the latter definition will be used throughout this patent disclosure. The second parameter which can be controlled is the amplitude level over the shelf plateau region. The third parameter which can be controlled is the shelf slope over the transition region from one plateau to the adjacent plateau. Shelving filters are commonly employed in commercial products such as equalizers and frequency-dividing crossovers, where one, two, or all three of the parameters described may be controlled.

Pass-band Filter. A pass-band filter is a filter type that passes the signal over a given frequency band or region and attenuates (or "rejects" or "stops") the signal over an adjacent frequency band(s) or region(s). The three parameters of a pass-band filter which are of interest in this patent disclosure are the pass-band corner frequency (also called the "cut-off" or "−3 dB" frequency), pass-band amplitude, and filter slope over the transition from the pass-band region to the stop-band region. A pass-band filter differs from a shelf filter in that a pass-band filter is intended to attenuate completely, or "stop" the audio signal over some region. The first parameter which can be controlled is the pass-band corner frequency. The second parameter which can be controlled is the amplitude of the filter over the pass-band region. The third parameter which can be controlled is the slope of the filter over the transition region between the band-pass-band region and the band-stop region. Pass-band filters are commonly employed in commercial products such as frequency-dividing crossovers, where one, two, or all three of the parameters described may be controlled.

Some of the objectives of a good user interface apparatus for the control of an audio spectrum processor include: 1) a placement of control elements and motion of operation which provides an intuitive relationship to the resulting frequency response of the filters, 2) an economical design which minimizes the number of control elements and the area necessary to arrange the controls, 3) a minimum set of control elements that still allows control of all the parameters for a given filter, 4) a single common user interface apparatus with a minimum set of control elements that allow the intuitive control of more than one type of filter, 5) a set of control elements that allow more than one rate of continuous filter change to be made, 6) a minimum set of control elements that allow the control of two or more filter parameters simultaneously, and 7) an ergonomic design which allows the control of multiple filter parameters and multiple filter types comfortably using one hand with the wrist confined to one location. Prior art devices have continued to be less than satisfactory, or completely void of accomplishing some of these objectives. Most user interface control devices used in commercial audio spectrum processors are deficient in one or more of the above mentioned objectives.

A common user interface control apparatus used in commercial parametric equalizers for the control of a bell filter is shown in FIG. 1, where each of the three parameters of center frequency, bandwidth, and amplitude are controlled by individual rotary controls. One deficiency of this type of user interface is that the placement of the controls and the motion of operating the controls does not provide an intuitive relationship to the resulting filter frequency response. Another deficiency of this type of interface is the necessity of two hands to operate two controls simultaneously.

Another common user interface control apparatus used in commercial parametric equalizers for the control of a bell filter is shown in FIG. 2, where one of the three parameters of center frequency, bandwidth, and amplitude are selected by a pushbutton key and then a common rotary thumb-wheel control is used to adjust the selected parameter. One deficiency of this type of user interface is that the placement of the controls and the motion of operating the controls does not provide an intuitive relationship to the filter frequency response. Another deficiency of this type of interface is that only one parameter can be adjusted at any given time.

Common user interface control devices for notch filters also include those of FIG. 1 and FIG. 2 except the amplitude controls are not present. The deficiencies already described for the control of bell filters also applies to the control of notch filters using the user interface control devices shown in FIG. 1 and FIG. 2.

A common user interface control apparatus used in commercial frequency-dividing crossover processors consisting pass-band filters also include those of FIG. 1 and FIG. 2, where the center rotary control in FIG. 1 operates the filter slope adjustment or the center pushbutton in FIG. 2 selects the slope parameter. The deficiencies already described for the control of bell filters also applies to the control of pass-band filters using the user interface control devices shown in FIG. 1 and FIG. 2.

A common user interface control apparatus used in commercial graphic equalizers comprising of a plurality of evenly-spaced, fixed-frequency bell filters is shown in FIG. 3. This interface provides a good intuitive relationship of the placement of the "slider" controls with the resulting response of the filter settings. One deficiency of this type of user interface is the potentially large number of control elements needed to implement a graphic equalizer which has a large number of ball filters. Another deficiency of this type of user interface is the potentially large area needed to accommodate the large number of controls. Furthermore, this arrangement of control elements would not be suited for the control of bell filters which have a variable center frequency, or for the control of pass-band filter types Another common user interface control apparatus used in commercial graphic equalizers comprising of a plurality of bell filters is shown in FIG. 4, where a particular bell filter is selected by depressing one of the pushbutton keys, then the amplitude is adjusted using the common rotary thumbwheel control. This interface is less intuitive than that of FIG. 3 and requires one more control element which makes this user interface less satisfactory than that of FIG. 3.

The user interface control apparatus shown in FIG. 5 provides a similarly intuitive operation as that shown in FIG. 3 by providing a pair of "boost/cut" pushbutton keys for each bell filter but suffers from the same deficiencies and requires twice as many control elements compared to that shown in FIG. 3.

Another common user interface control apparatus used in commercial graphic equalizers is that as shown in FIG. 6, where the left and right pushbutton keys select a particular bell filter and the top and bottom pushbutton keys increase and decrease the selected filter's amplitude respectively. While this user interface is intuitive to operate and requires only a minimal number of control elements, it is deficient in that the four keys alone can only operate at one rate of continuous change in either filter selection or filter amplitude. Furthermore, this user interface comprising of the four keys alone could not control more than two parameters of a given filter type.

The present invention is premised on accommodating all of the objectives described above to a satisfactory level. Achievement of several or all of the objectives mentioned would provide a user interface control device which is superior to prior art devices.

SUMMARY OF THE INVENTION

In summary, the present invention is a user interface control device, which comprises of five pushbutton keys arranged in a cross pattern, for the control of electronic filter parameters of an audio spectrum processor. The depression of the invention's control keys provides an intuitive relationship to the resulting frequency response change. Depression of particular keys or particular combinations of keys can be made to electronically control multiple filter parameters, some simultaneously, for different filter types depending on the filter type for which the invention is applied. The unique arrangement of the invention's pushbutton keys facilitates an intuitive operation of the various parameters for bell, notch, shelf, and pass-band audio filter types with a minimal number of control elements and minimal control area. Additionally, the unique arrangement of keys facilitates intuitive control of some filter parameters at two rates of continuous change.

BRIEF DESCRIPTION OF THE DRAWINGS

Features of the invention will be more readily apparent from the following detailed description and appended claims when taken in conjunction with the drawings in which:

DESCRIPTION OF THE PREFERRED EMBODIMENT

Figure 7:
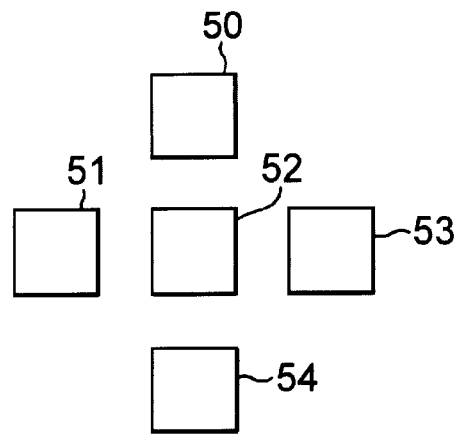
FIG. 7 shows the user interface control invention as an arrangement of five pushbutton keys arranged in a cross pattern.
Figure 8A:
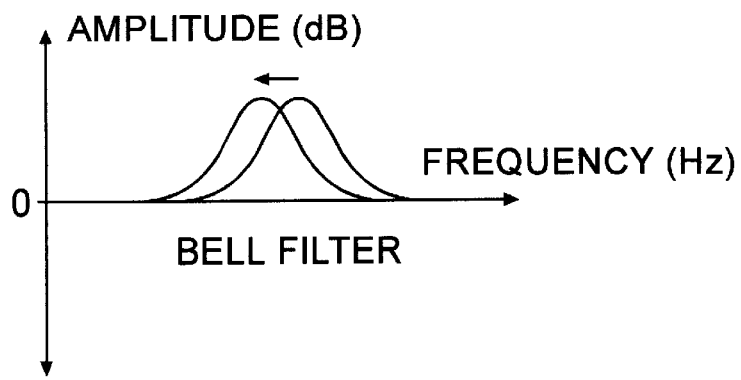
FIG. 8a shows the frequency response of a bell filter, where the center frequency parameter is changing in a decreasing direction.
Figure 8B:
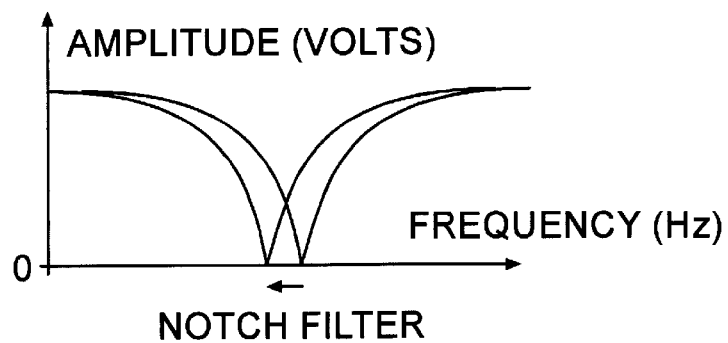
FIG. 8b shows the frequency response of a notch filter, where the center frequency parameter is changing in a decreasing direction.
Figure 8C:
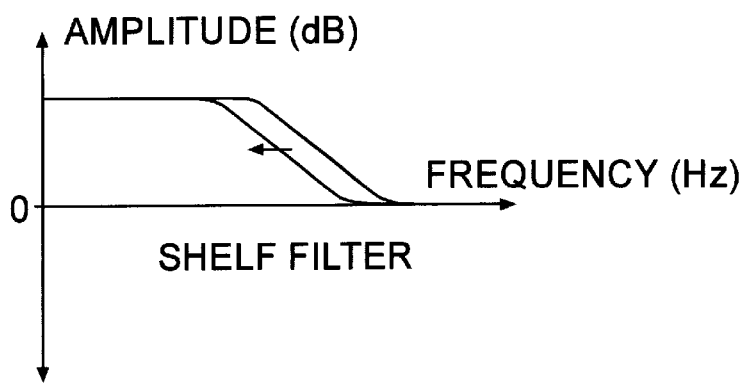
FIG. 8c shows the frequency response of a shelf filter, where the transition frequency parameter is changing in a decreasing direction.
Figure 8D:
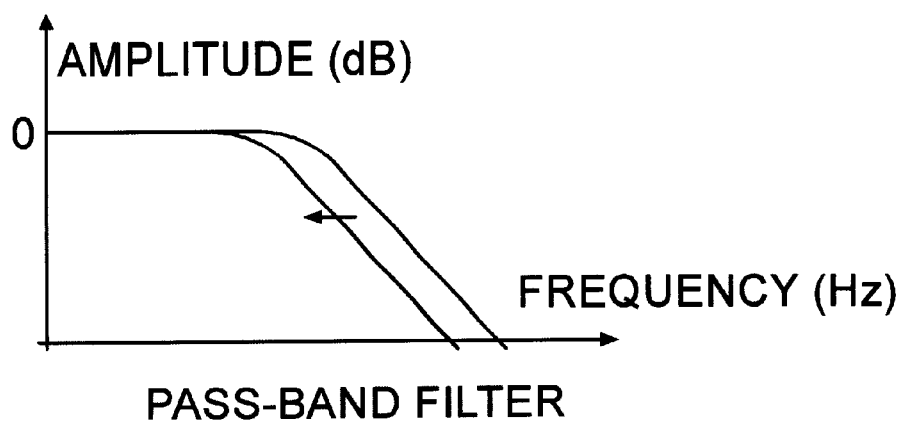
FIG. 8d shows the frequency response of a pass-band filter, where the corner frequency parameter is changing in a decreasing direction.
Figure 8E:
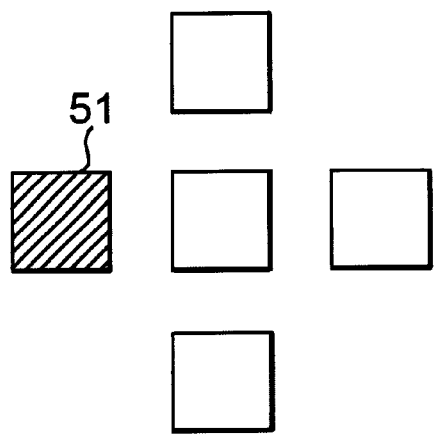
FIG. 8e shows the five-key user interface, where the darkened key depicts the key which is depressed and held, as a means of controlling the filter parameter changes shown in FIGS. 8a–8d.

With reference to FIG. 7, the present invention consists of five pushbutton keys arranged in a cross pattern which provides an intuitive user interface for the control of several different parameters of electronic filters, and of different filter types, which are commonly used in audio spectrum equalizers and processors. By depressing particular keys, or particular combinations of keys, filter parameters can be electronically controlled in an intuitive fashion.

With reference to FIGS. 8a–8e, if the user interface is applied to the control of bell, notch, shelf, or pass-band filters, then depressing key 51 would cause a left movement in the filter frequency parameter. More specifically, this action would cause a decrease in the center frequency in the case of a bell filter or notch filter, or a decrease in the transition frequency in the case of a shelf filter, or a decrease in the corner frequency in the case of a pass-band filter. With reference to FIGS. 9a–9e, likewise if the user interface is applied to the control of bell, notch, shelf, or pass-band filters, then depressing key 53 would cause a right movement in the filter frequency parameter. More specifically, this action would cause an increase in the center frequency in the case of a bell filter or notch filter, or an increase in the transition frequency in the case of a shelf filter, or an increase in the corner frequency in the case of a pass-band filter.

Figure 10A:
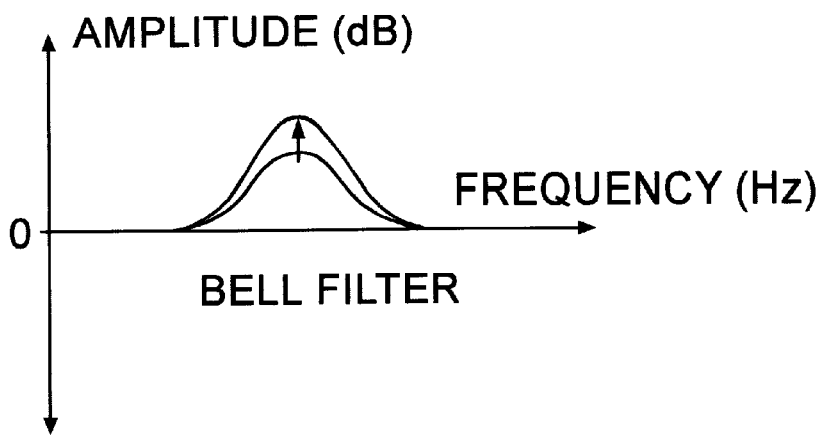
FIG. 10a shows the frequency response of a bell filter, where the amplitude parameter is changing in an increasing direction.
Figure 10B:
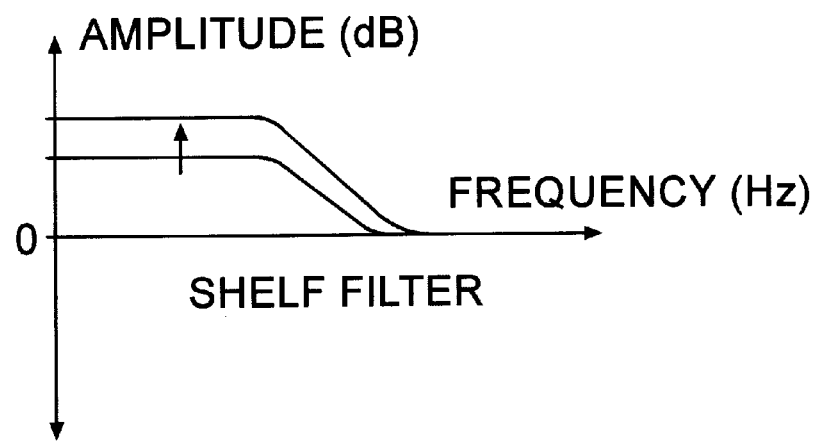
FIG. 10b shows the frequency response of a shelf filter, where the shelf amplitude parameter is changing in an increasing direction.
Figure 10C:
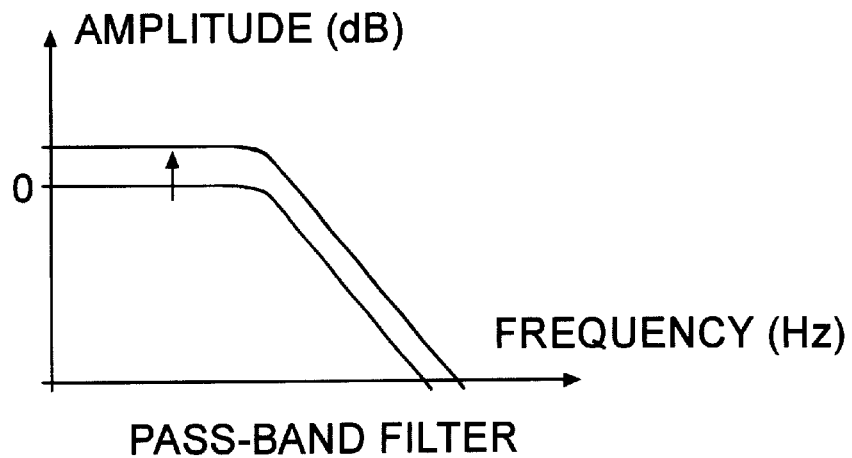
FIG. 10c shows the frequency response of a pass-band filter, where the pass-band amplitude parameter is changing in an increasing direction.
Figure 10D:
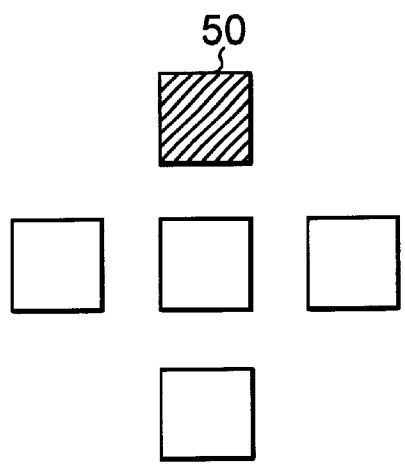
FIG. 10d shows the five-key user interface, where the darkened key depicts the key which is depressed and held, as a means of controlling the filter parameter changes shown in FIGS. 10a–10c.
Figure 11A:
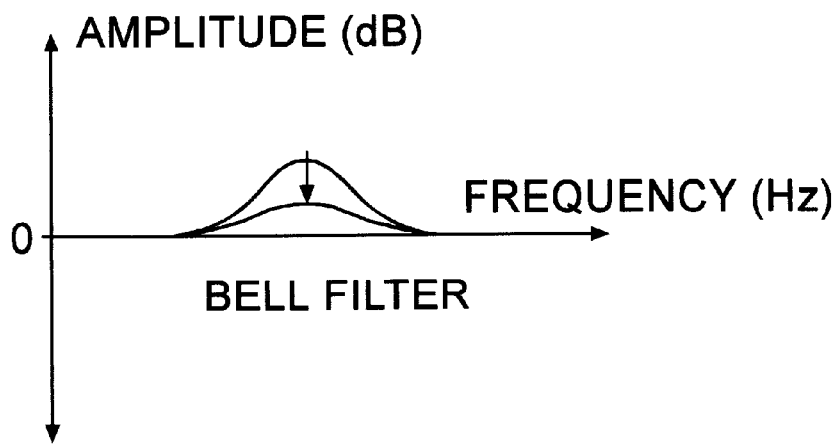
FIG. 11a shows the frequency response of a bell filter, where the amplitude parameter is changing in a decreasing direction.
Figure 11B:
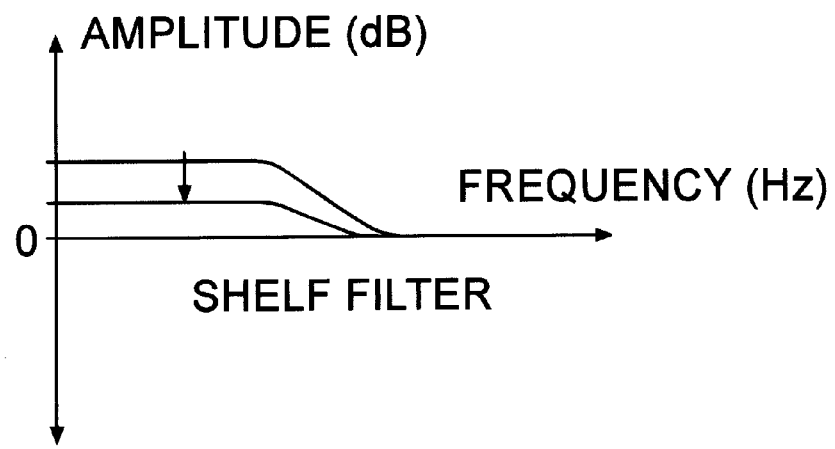
FIG. 11b shows the frequency response of a shelf filter, where the shelf amplitude parameter is changing in a decreasing direction.
Figure 11C:
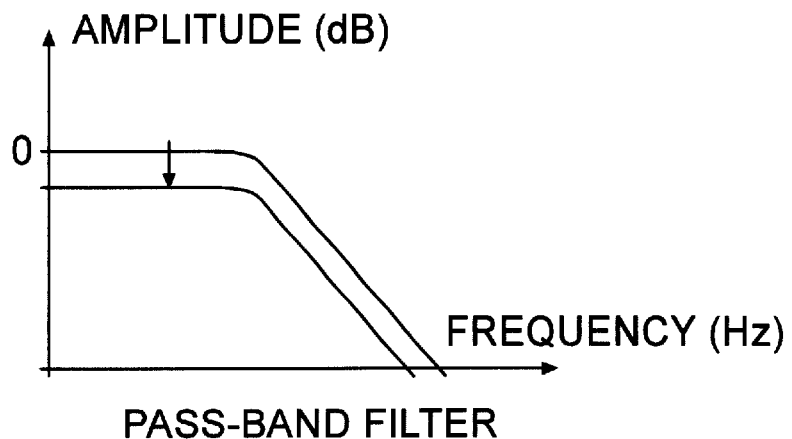
FIG. 11c shows the frequency response of a pass-band filter, where the pass-band amplitude parameter is changing in a decreasing direction.
Figure 11D:
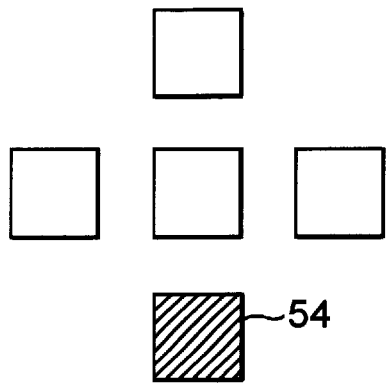
FIG. 11d shows the five-key user interface, where the darkened key depicts the key which is depressed and held, as a means of controlling the filter parameter changes shown in FIGS. 11a–11c.
Figure 12A:
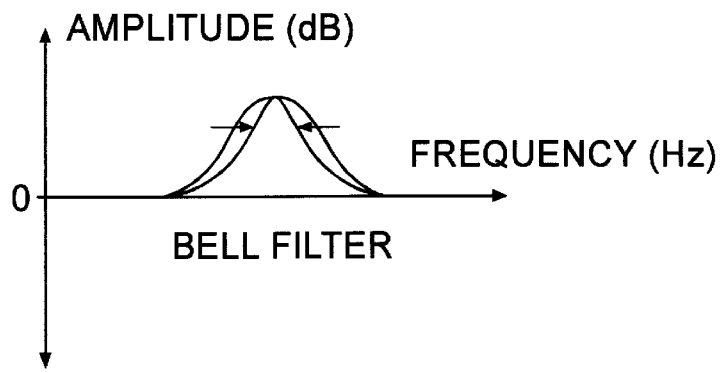
FIG. 12a shows the frequency response of a bell filter, where the bandwidth parameter is changing in an inward, or narrower direction.
Figure 12B:
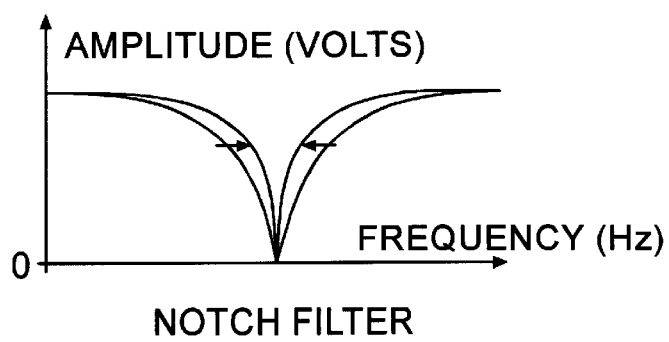
FIG. 12b shows the frequency response of a notch filter, where the bandwidth parameter is changing in an inward, or narrower direction.
Figure 12C:
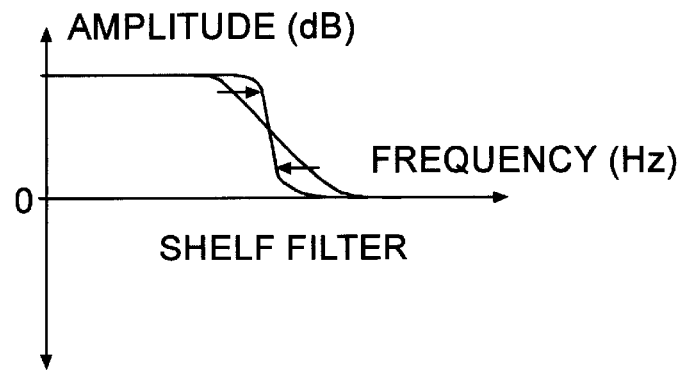
FIG. 12c shows the frequency response of a shelf filter, where the transition slope parameter is changing in a more sloped, or narrower direction.
Figure 12D:
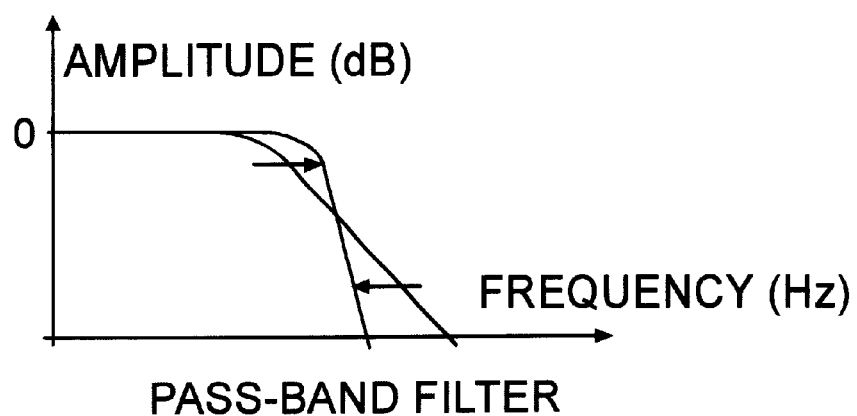
FIG. 12d shows the frequency response of a pass-band filter, where transition slope parameter is changing in a more sloped, or narrower direction.
Figure 12E:
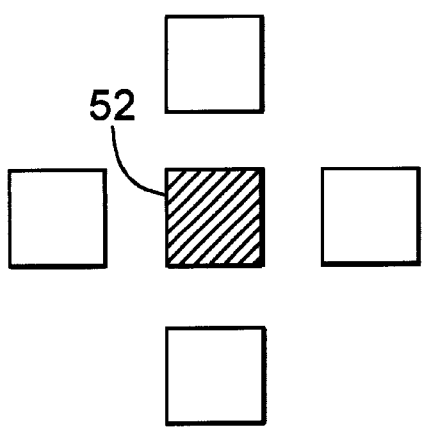
FIG. 12e shows the five-key user interface, where the darkened key depicts the key which is depressed and held, as a means of controlling the filter parameter changes shown in FIGS. 12a–12d.
Figure 13A:
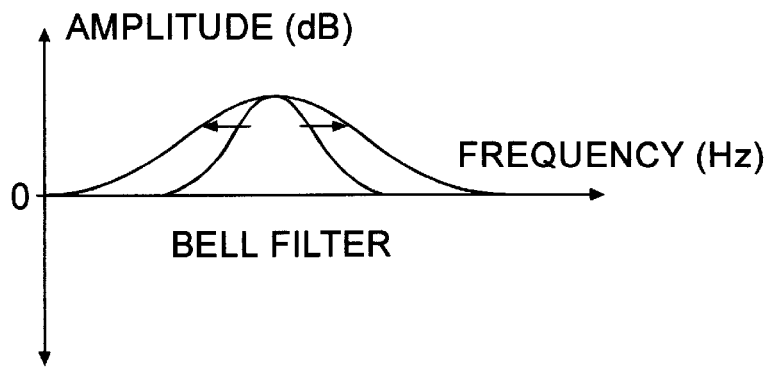
FIG. 13a shows the frequency response of a bell filter, where the bandwidth parameter is changing in an outward, or wider direction.
Figure 13B:
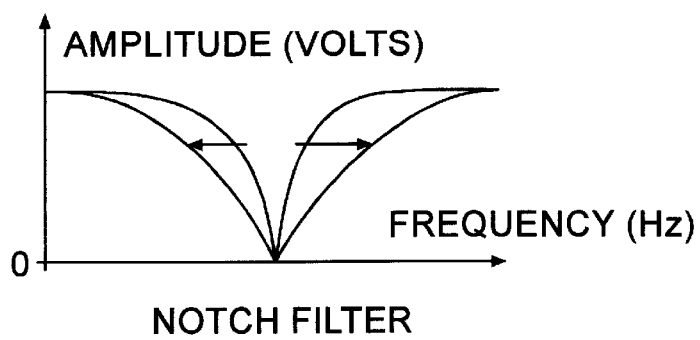
FIG. 13b shows the frequency response of a notch filter, where the bandwidth parameter is changing in an outward, or wider direction.
Figure 13C:
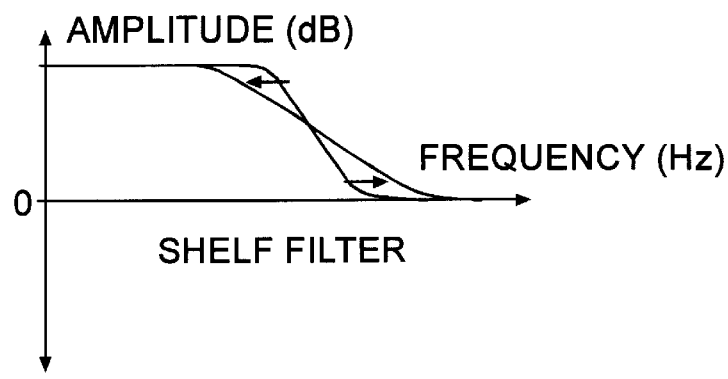
FIG. 13c shows the frequency response of a shelf filter, where the transition slope parameter is changing in a less sloped, or wider direction.
Figure 13D:
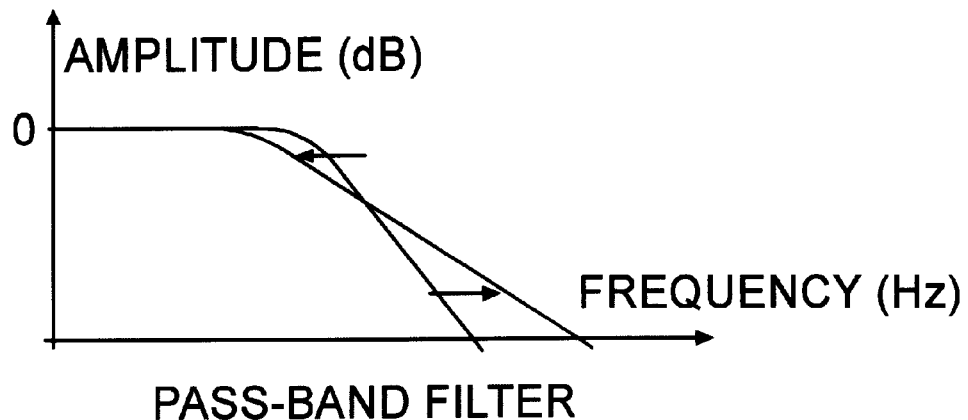
FIG. 13d shows the frequency response of a pass-band filter, where transition slope parameter is changing in a less sloped, or wider direction.
Figure 13E:
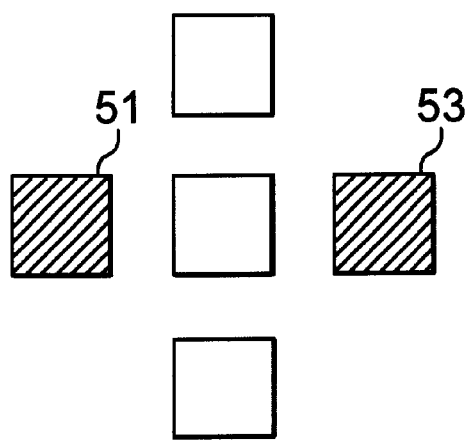
FIG. 13e shows the five-key user interface, where the darkened keys depict the keys which are depressed and held, as a means of controlling the filter parameter changes shown in FIGS. 13a–13d.

With reference to FIGS. 10a–10c, if the user interface is applied to the control of bell, shelf, or pass-band filters, then depressing key 50 would cause an upward movement in the filter amplitude parameter. More specifically, this action would cause an increase in the filter's center amplitude in the case of a bell filter, or an increase in the shelf amplitude in the case of a shelf filter, or an increase in the pass-band amplitude in the case of a pass-band filter. With reference to FIGS. 11a–11c, likewise if the user interface is applied to the control of bell, shelf, or pass-band filters, then depressing key 54 would cause a downward movement in the filter amplitude parameter. More specifically, this action would cause a decrease in the filter's center amplitude in the case of a bell filter, or a decrease in the shelf amplitude in the case of a shelf filter, or a decrease in the pass-band amplitude in the case of a pass-band filter.

Figure 14A:
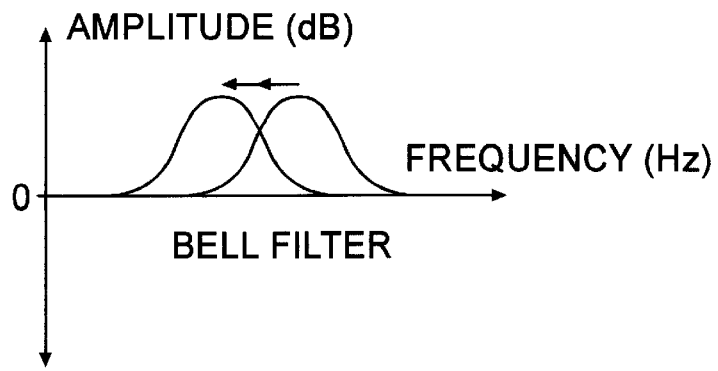
FIG. 14a shows the frequency response of a bell filter, where the center frequency parameter is changing in a decreasing direction at a fast rate.
Figure 14B:
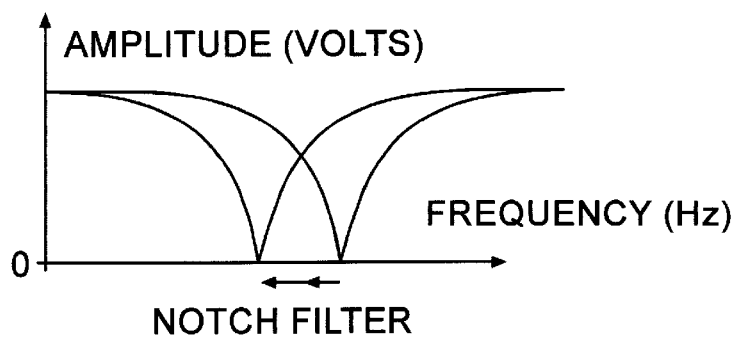
FIG. 14b shows the frequency response of a notch filter, where the center frequency parameter is changing in a decreasing direction at a fast rate.
Figure 14C:
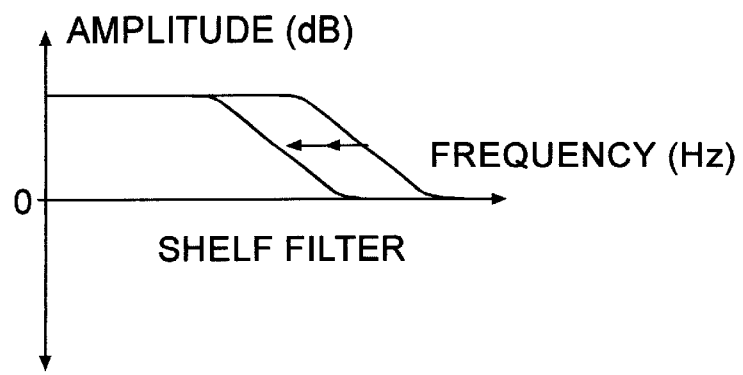
FIG. 14c shows the frequency response of a shelf filter, where the transition frequency parameter is changing in a decreasing direction at a fast rate.
Figure 14D:
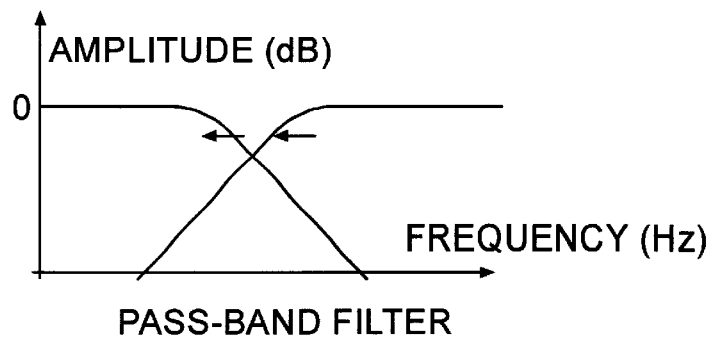
FIG. 14d shows the frequency response of two adjacent pass-band filters, as typically used in frequency-dividing crossovers, where the corner frequency parameters of both filters are changing in a decreasing direction while maintaining a constant difference between the two corner frequencies.
Figure 14E:
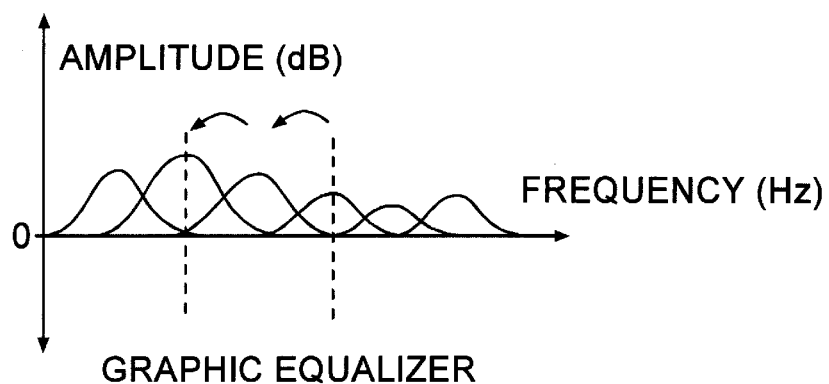
FIG. 14e shows a plurality of bell filters evenly spaced on a logarithmic frequency scale, as typically used in a graphic equalizer, where the filters are scanned, for the purpose of selecting a particular filter, at a fast rate in the decreasing direction.
Figure 14F:
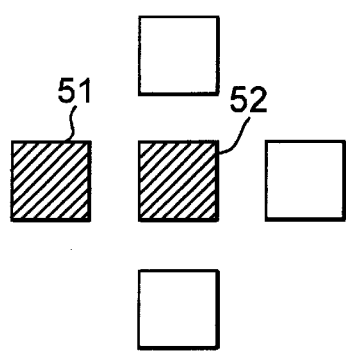
FIG. 14f shows the five-key user interface, where the darkened keys depict the keys which are depressed and held, as a means of controlling the filter parameter changes shown in FIGS. 14a–14d, or the filter selection as shown in FIG. 14e.

With reference to FIGS. 12a–12e, if the user interface is applied to the control of bell, notch, shelf, or pass-band filters, then depressing key 52 would cause an inward movement in the filter bandwidth or transition parameter. More specifically, this action would cause a narrowing of the bandwidth in the case of a bell filter or notch filter, or a narrowing of the transition region (greater filter slope) in the case of a shelf filter or a pass-band filter. With reference to FIGS. 13a–13e, likewise if the user interface is applied to the control of bell, notch, shelf, or pass-band filters, then depressing keys 51 and 53 simultaneously would cause an outward movement in the filter bandwidth or transition parameter. More specifically, this action would cause a widening of the bandwidth in the case of a bell filter or notch filter, or a widening of the transition region (reduced filter slope) in the case of a shelf filter or a pass-band With reference to FIGS. 14a–14c, if the user interface is applied to the control of bell, notch, or shelf filters, then depressing keys 51 and 52 simultaneously as shown in FIG. 14f would cause a left movement in the filter frequency parameter as described for FIGS. 8a–8c but at a faster rate. With reference to FIG. 14d, if the user interface is applied to the control of two adjacent pass-band filters, or "crossover" filters, then depressing keys 51 and 52 simultaneously as shown in FIG. 14f would cause a left movement in the corner frequency parameter for both filters, for the purpose of maintaining a constant difference as measured in octaves, between the two filters' corner frequencies. With reference to FIG. 14e, if the user interface is applied to the control of a plurality of bell filters which are evenly spaced as shown on a logarithmic frequency scale, most commonly known as a "graphic" equalizer, then depressing keys 51 and 52 simultaneously as shown in FIG. 14f would cause a scanning of the filters, for the purpose of selecting a particular filter, at a fast rate in the left or decreasing frequency direction.

Figure 9A:
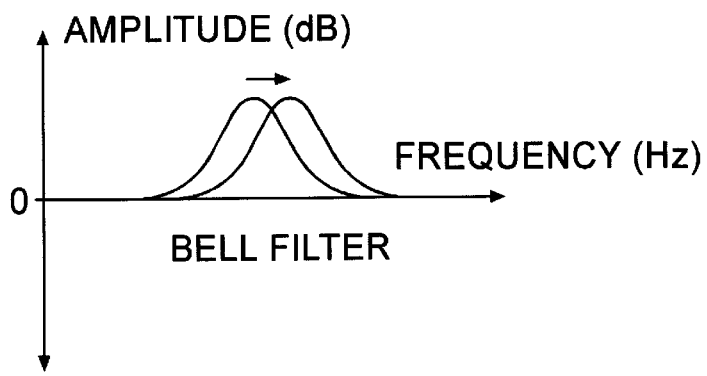
FIG. 9a shows the frequency response of a bell filter, where the center frequency parameter is changing in an increasing direction.
Figure 9B:
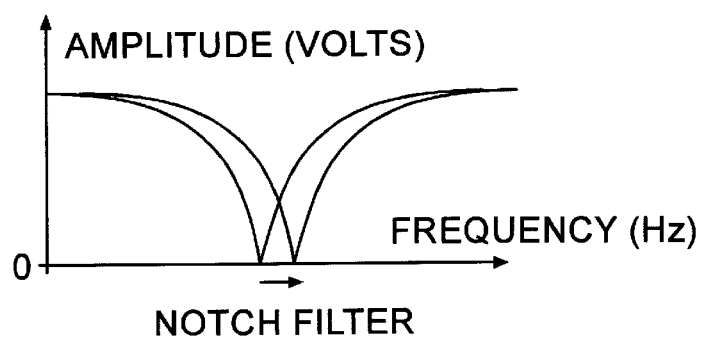
FIG. 9b shows the frequency response of a notch filter, where the center frequency parameter is changing in an increasing direction.
Figure 9C:
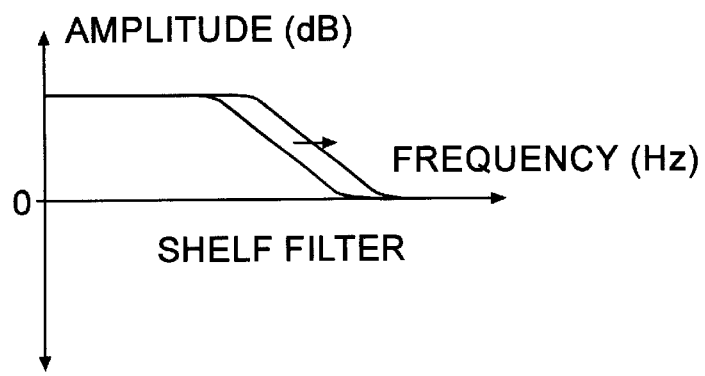
FIG. 9c shows the frequency response of a shelf filter, where the transition frequency parameter is changing in an increasing direction.
Figure 9D:
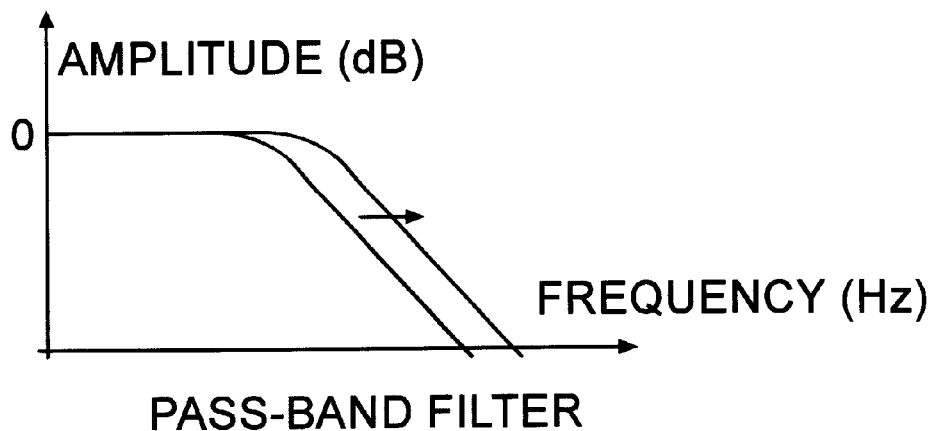
FIG. 9d shows the frequency response of a pass-band filter, where the corner frequency parameter is changing in an increasing direction.
Figure 9E:
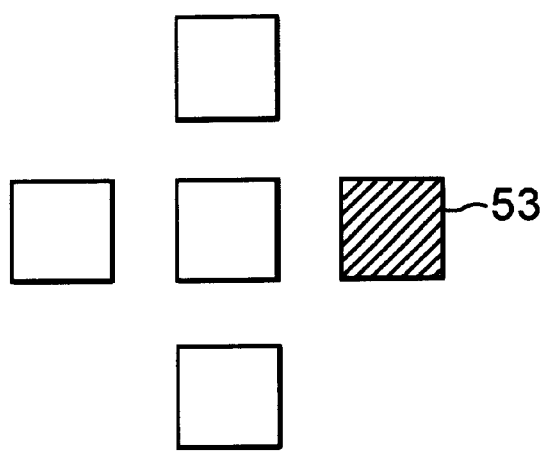
FIG. 9e shows the five-key user interface, where the darkened key depicts the key which is depressed and held, as a means of controlling the filter parameter changes shown in FIGS. 9a–9d.
Figure 15A:
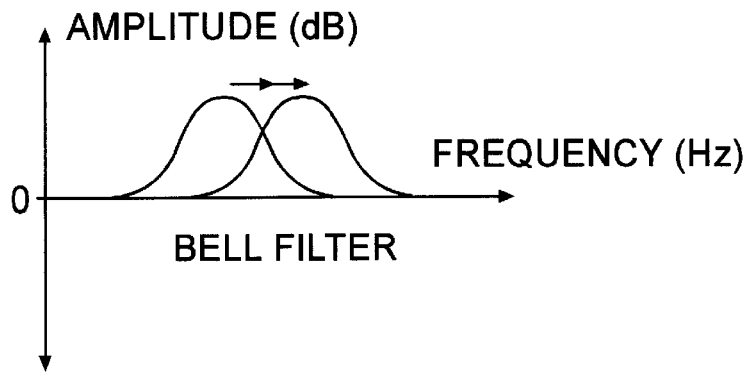
FIG. 15a shows the frequency response of a bell filter, where the center frequency parameter is changing in an increasing direction at a fast rate.
Figure 15B:
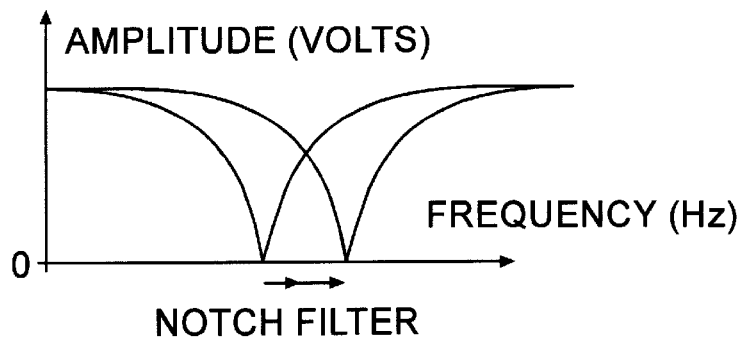
FIG. 15b shows the frequency response of a notch filter, where the center frequency parameter is changing in an increasing direction at a fast rate.
Figure 15C:
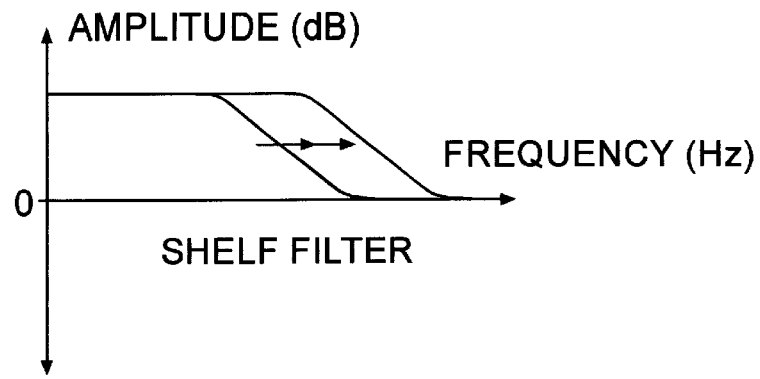
FIG. 15c shows the frequency response of a shelf filter, where the transition frequency parameter is changing in an increasing direction at a fast rate.
Figure 15D:
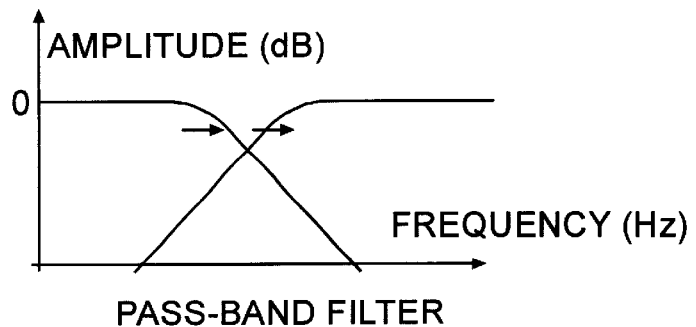
FIG. 15d shows the frequency response of two adjacent pass-band filters, as typically used in frequency-dividing crossovers, where the corner frequency parameters of both filters are changing in an increasing direction while maintaining a constant difference between the two corner frequencies.
Figure 15E:
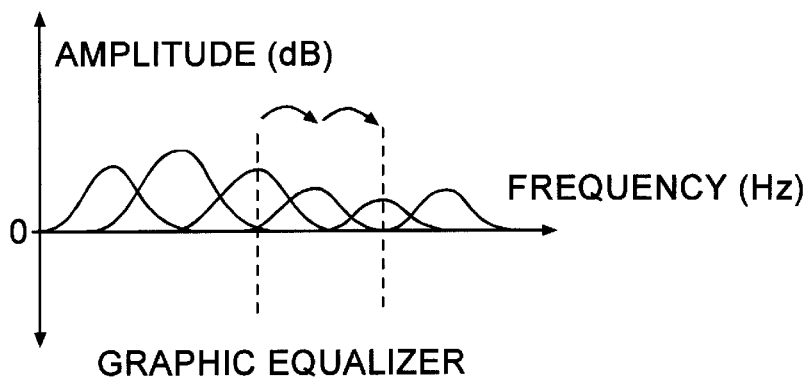
FIG. 15e shows a plurality of bell filters evenly spaced on a logarithmic frequency scale, as typically used in a graphic equalizer, where the filters are scanned, for the purpose of selecting a particular filter, at a fast rate in the increasing direction.
Figure 15F:
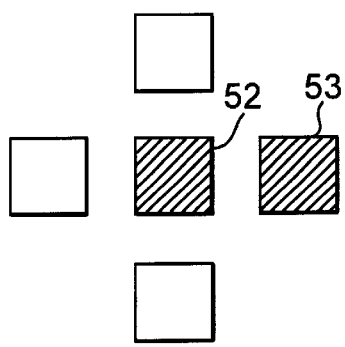
FIG. 15f shows the five-key user interface, where the darkened keys depict the keys which are depressed and held, as a means of controlling the filter parameter changes shown in FIGS. 15a–15d, or the filter selection as shown in FIG. 15e.

With reference to FIGS. 15a–15c, likewise if the user interface is applied to the control of bell, notch, or shelf filters, then depressing keys 52 and 53 simultaneously as shown in FIG. 15f would cause a right movement in the filter frequency parameter as described for FIGS. 9a–9c but at a faster rate. With reference to FIG. 15d, if the user interface is applied to the control of two adjacent pass-band filters, or "crossover" filters, then depressing keys 52 and 53 simultaneously as shown in FIG. 15f would cause a right movement in the corner frequency parameter for both filters, for the purpose of maintaining a constant difference as measured in octaves, between the two filters' corner frequencies. With reference to FIG. 15e, if the user interface is applied to the control of a plurality of bell filters which are evenly spaced as shown on a logarithmic frequency scale, then depressing keys 52 and 53 simultaneously as shown in FIG. 15f would cause a scanning of the filters, for the purpose of selecting a particular filter, at a fast rate in the right or increasing frequency direction.

Figure 1:
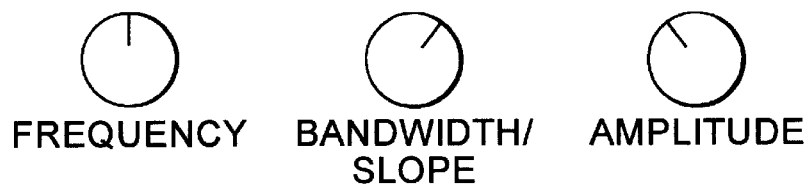
FIGS. 1–6 show examples of prior art user interface control apparatus for filters.
Figure 2:
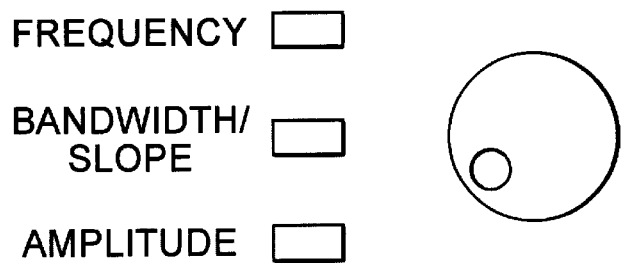
Figure 3:
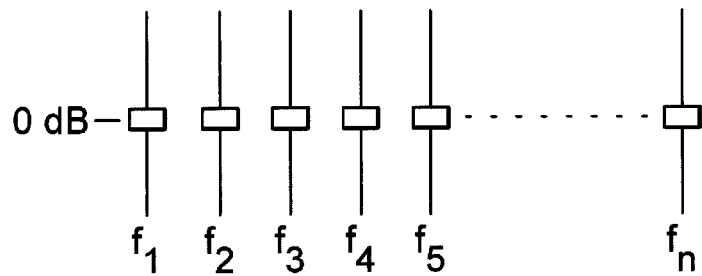
Figure 4:
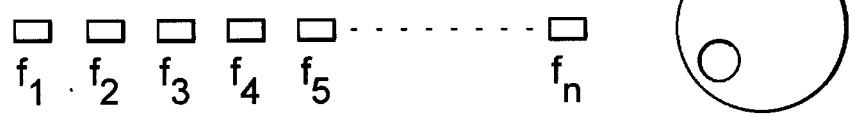
Figure 5:
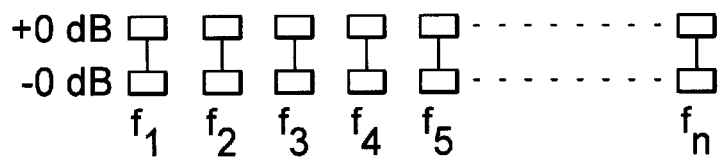
Figure 6:
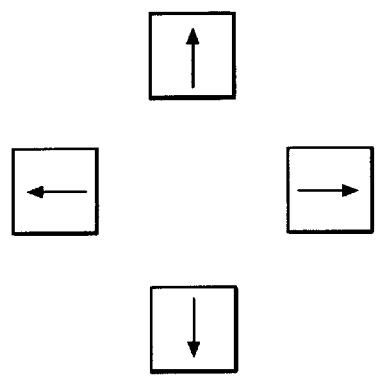
Figure 16A:
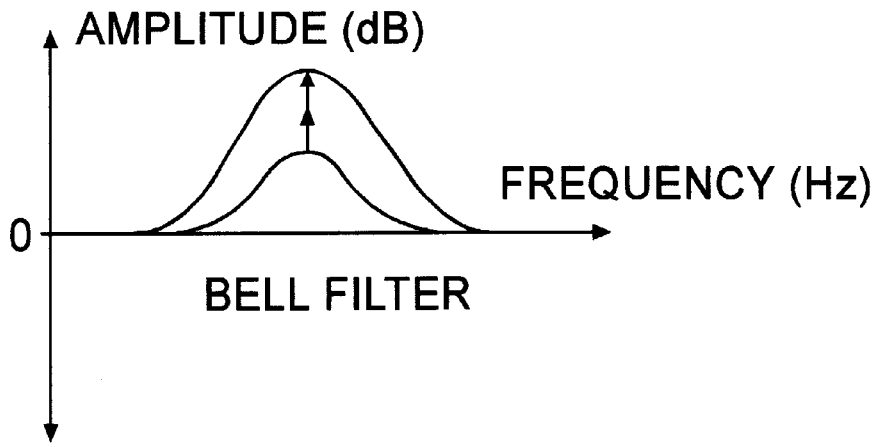
FIG. 16a shows the frequency response of a bell filter, where the amplitude parameter is changing in an increasing direction at a fast rate.
Figure 16B:
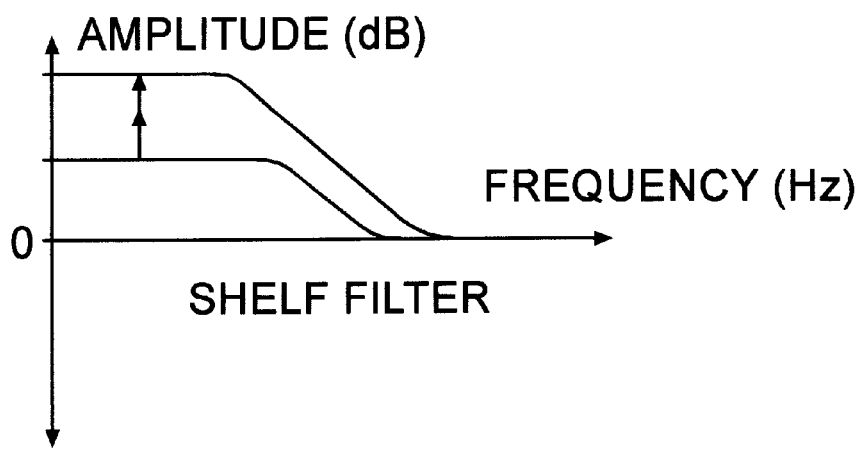
FIG. 16b shows the frequency response of a shelf filter, where the shelf amplitude parameter is changing in an increasing direction at a fast rate.
Figure 16C:
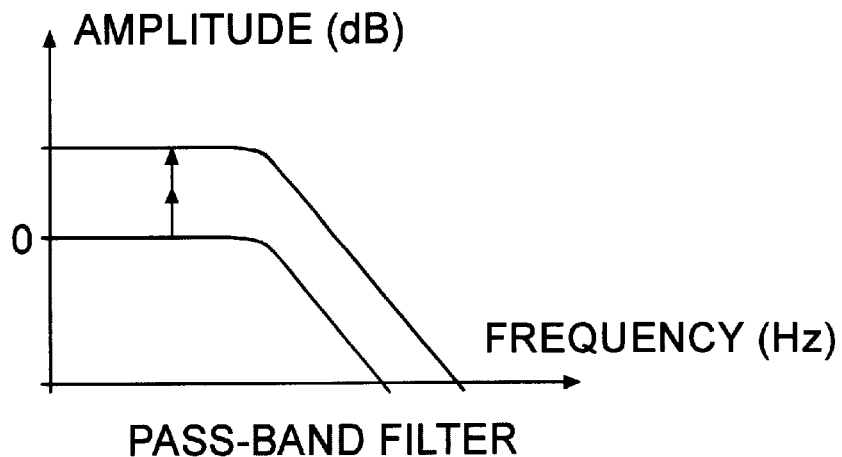
FIG. 16c shows the frequency response of a pass-band filter, where the pass-band amplitude parameter is changing in an increasing direction at a fast rate.
Figure 16D:
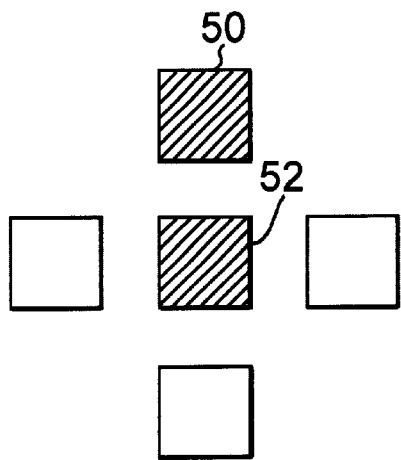
FIG. 16d shows the five-key user interface, where the darkened keys depict the keys which are depressed and held, as a means of controlling the filter parameter changes shown in FIGS. 16a–16c.
Figure 17A:
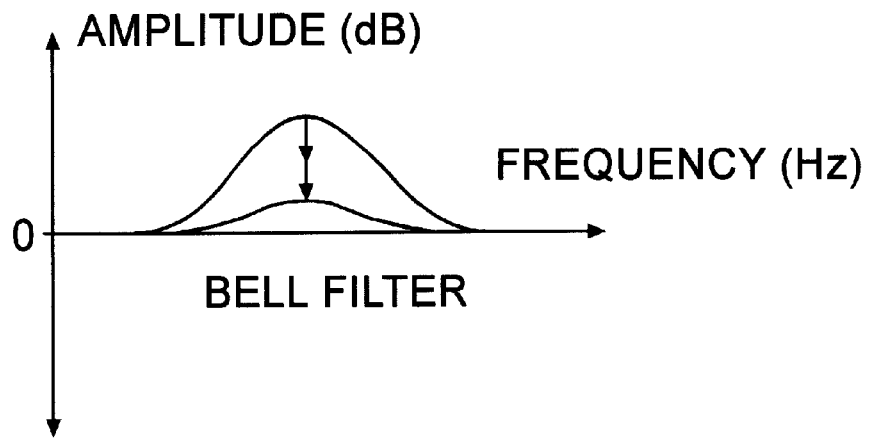
FIG. 17a shows the frequency response of a bell filter, where the amplitude parameter is changing in a decreasing direction at a fast rate.
Figure 17B:
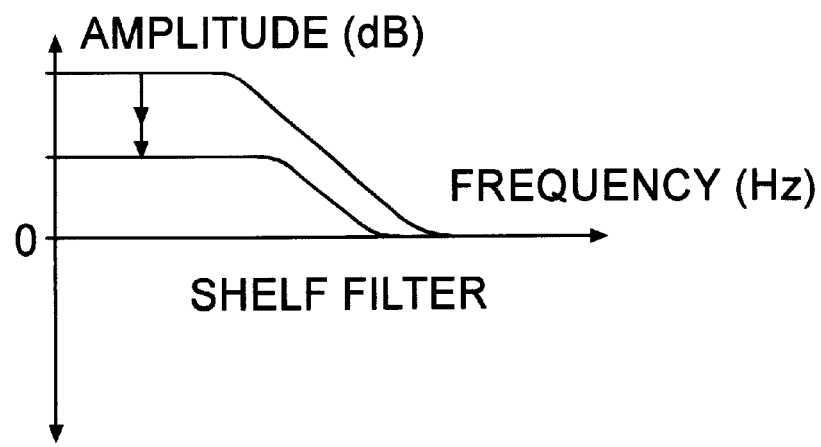
FIG. 17b shows the frequency response of a shelf filter, where the shelf amplitude parameter is changing in a decreasing direction at a fast rate.
Figure 17C:
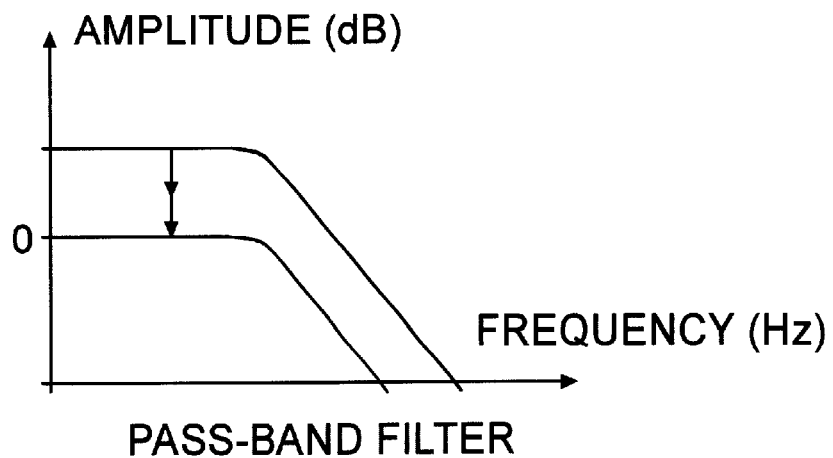
FIG. 17c shows the frequency response of a pass-band filter, where the pass-band amplitude parameter is changing in a decreasing direction at a fast rate.
Figure 17D:
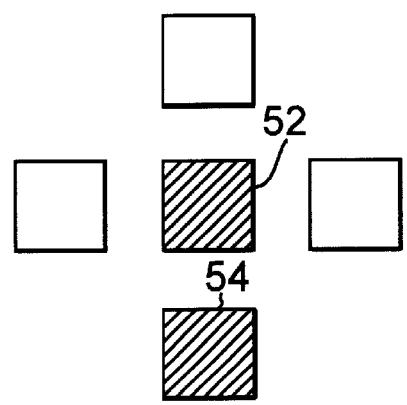
FIG. 17d shows the five-key user interface, where the darkened keys depict the keys which are depressed and held, as a means of controlling the filter parameter changes shown in FIGS. 17a–17c.

With reference to FIGS. 16a–6d, if the user interface is applied to the control of bell, shelf, or pass-band filters, then depressing keys 50 and 52 simultaneously would cause an upward movement in the filter amplitude parameter as described for FIGS. 10a–10c but at a faster rate. With reference to FIGS. 17a–17d, likewise if the user interface is applied to the control of bell, shelf, or pass-band filters, then depressing keys 52 and 54 simultaneously would cause a downward movement in the filter amplitude parameter as described for FIGS. 11a–11c but at a faster rate.

While the present invention has been disclosed with reference to specific frequency response shapes of the filter types described, the frequency response shapes chosen are for illustrative purposes and are a subset of frequency response shapes which may be obtained using the user interface invention. For example, all of the illustrations of bell filters and shelf filters depict an amplified amplitude response shape. Applying the present invention to the control of bell and shelving filters to obtain an attenuated amplitude response shape would be readily apparent to those skilled in the art, as being no different in concept.

The filters described above are well known in the art. It is also well known that two or more filters of each type may be included in an apparatus and the apparatus may be provided with suitable means for selecting one or more of the filters for operation and for setting its parameters.

While only one particular embodiment of the invention has been disclosed herein, namely five physical pushbutton keys only, arranged in a cross pattern, it would be readily apparent to persons skilled in the art that numerous changes and modifications can be made thereto, without departing from the spirit of the invention. Such changes and modifications could be the addition of more pushbutton keys positioned around the existing five keys, or implementing the invention using "virtual" keys or "soft" keys on graphic display devices.

What is claimed is:

1. A filter user interface control apparatus comprising:
   five keys including a central key and four keys arranged radially around the central key and defining first and second pairs of opposing keys for controlling two or more parameters of a filter;

the first pair of opposing keys for changing a first parameter of a filter;

the second pair of opposing keys for changing a second parameter of the filter; and the central key and each of the radial keys for operating simultaneously to alter the rate of change of the one of the parameters of the filter.

2. The user interface of claim 1 wherein the central key and two other keys are operable to change a third parameter of the filter.

3. A filter user interface control apparatus comprising:

five keys including a central key and four keys arranged radially around the central key and defining first and second pairs of opposing keys;

the first pair of opposing keys including one key for increasing a first parameter of a filter and the other key for decreasing the first parameter of the filter;

the second pair of keys including one key for increasing a second parameter of the filter and the other key for decreasing the second parameter of the filter; and the central key and each of the radial keys for operating simultaneously to alter the rate of change of the increase or decrease of one of the parameters of the filter.

4. The user interface of claim 3 for selecting at two rates of speed one bell filter from a group of bell filters, wherein depressing the left key changes the bell filter selected to a different and lower-frequency bell filter at a slow rate, depressing the left key and the center key simultaneously changes the bell filter selected to a different and lower-frequency bell filter at a fast rate, depressing the right key changes the bell filter selected to a different and higher-frequency bell filter at a slow rate, depressing, the right key and the center key simultaneously changes the bell filter selected to a different and higher-frequency bell filter at a fast rate.

5. The user interface of claim 3 for selecting at two rates of speed one notch filter from a group comprising a plurality of notch filters, wherein depressing the left key changes the notch filter selected to a different and lower-frequency notch filter at a slow rate, depressing the left key and the center key simultaneously changes the notch filter selected to a different and lower-frequency notch filter at a fast rate, depressing the right key changes the notch filter selected to a different and higher-frequency notch filter at a slow rate, depressing the right key and the center key simultaneously changes the notch filter selected to a different and higher-frequency notch filter at a fast rate.

6. The user interface of claim 3 wherein the central key and two other keys operate for increasing and decreasing a third parameter of the filter.

7. The user interface of claim 6 wherein the filter is a bell filter and the parameters include center frequency, bandwidth and amplitude.

8. The user interface of claim 6 wherein the filter is a shelf filter and the parameters include transition frequency, amplitude, and slope.

9. The user interface of claim 6 wherein the filter is a pass-band and the parameters include corner frequency, amplitude, and slope.

10. The user interface of claim 3 wherein at least two keys are simultaneously operable for simultaneously changing two of the three parameters.

11. The user interface of claim 3 wherein at least two keys are simultaneously operable for simultaneously changing the two parameters.

12. The user interface of claim 3 wherein the filter is a bell filter, and the parameters include two parameters of the group comprising of center frequency, bandwidth and amplitude.

13. The user interface of claim 3 wherein the filter is a notch filter and the parameters include center frequency and bandwidth.

14. The user interface of claim 3 wherein the filter is a shelf filter and the parameters include two selected from the group comprising of transition frequency, amplitude, and slope.

15. The user interface of claim 3 wherein the filter is a pass-band and the parameters include two selected from the group consisting of corner frequency, amplitude, and slope.

16. The user interface of claim 3 further comprising means for selecting one or more filters selected from the group consisting of bell filters, notch filters, shelf filters and pass-band filters and means for connecting the selected filter to the keys for controlling the operation of the selected filter.

17. A user interface filter control apparatus comprising five pushbutton keys arranged in a cross pattern where all three parameters of center frequency, bandwidth, and amplitude of a bell filter response are controlled, wherein the left key decreases the filter response center frequency, the right key increases the filter response center frequency, the top key increases the filter response amplitude, the bottom key decreases the filter response amplitude, the center key narrows the filter response bandwidth, and both left and right keys operate simultaneously for widening the filter response bandwidth.

18. The user interface control apparatus as set fourth in claim 17, wherein the response of center frequency is selectably controlled at one of two rates of speed and wherein the left key decreases the filter response center frequency at a slow rate and the left key and the center key operate simultaneously to decrease the filter response center frequency at a fast rate, the right key increases the filter response center frequency at a slow rate, and the right key and the center key operate simultaneously to increase the filter response center frequency at a fast rate.

19. The user interface control apparatus as set fourth in claim 17, wherein the response amplitude is controlled at two rates of speed and wherein the bottom key decreases the filter response amplitude at a slow rate, the bottom key and the center key operate simultaneously to decrease the filter response amplitude at a fast rate, the top key increases the filter response amplitude at a slow rate, and the top key and the center key operate simultaneously to increase the filter response amplitude at a fast rate.

20. The user interface control apparatus as set fourth in claim 17 further comprising means for selecting one or more of a plurality of bell filters and controlling the selected bell filter with the five keys of claim 17.

21. A user interface control apparatus for a notch filter having controls for parameters of center frequency and bandwidth comprising five pushbutton keys arranged in a cross pattern wherein the left key decreases the filter response center frequency, the right key increases the filter response center frequency, the center key narrows the filter response bandwidth, and both left and right keys simultaneously widens the filter response bandwidth.

22. The user interface control apparatus as set fourth in claim 21, where the notch filter response center frequency has two rates of speed and the left key decreases the filter response center frequency at a slow rate, the left key and the center key operate simultaneously to decrease the filter response center frequency at a fast rate, the right key increases the filter response center frequency at a slow rate, and the right key and the center key operate simultaneously to increase the filter response center frequency at a fast rate.

23. The user interface control apparatus as set fourth in claim 22 further comprising means for selecting one or more of a plurality of notch filters and controlling the selected notch filter with the five keys.

24. A user interface control apparatus for a shelf filter having controllable parameters of transition frequency, shelf amplitude, and transition slope comprising five pushbutton keys arranged in a cross pattern wherein the left key decreases the filter response transition frequency, the right key increases the filter response transition frequency, the top key increases the filter response shelf amplitude, the bottom key decreases the filter response shelf amplitude, the center key increases the filter response transition slope, and both left and right keys operate together to simultaneously decrease the filter response transition slope.

25. The user interface control apparatus as set fourth in claim 24 wherein the shelf filter response transition frequency has two rates of speed and the left key decreases the filter response transition frequency at a slow rate, the left key and the center key operate together simultaneously to decrease the filter response transition frequency at a fast rate, the right key increases the filter response transition frequency at a slow rate, and the right key and the center key operate together simultaneously to increase the filter response transition frequency at a fast rate.

26. The user interface control apparatus as set fourth in claim 24 wherein the shelf filter response shelf amplitude has two rates of speed and the bottom key decreases the filter response shelf amplitude at a slow rate, the bottom key and the center key operate together simultaneously to decrease the filter response shelf amplitude at a fast rate, the top key increases the filter response shelf amplitude at a slow rate, and the top key and the center key operate together simultaneously to increase the filter response shelf amplitude at a fast rate.

27. A user interface control apparatus for a pass-band filter to control three parameters comprising corner frequency, pass-band amplitude, and transition slope between pass-band and stop-band regions comprising five pushbutton keys arranged in a cross pattern and wherein left key decreases the filter response comer frequency, the right key increases the filter response comer frequency, the top key increases the filter response pass-band amplitude, the bottom key decreases the filter response pass-band amplitude, the center key increases the filter response transition slope between pass-band and stop-band regions, and both left and right keys operate together to simultaneously decreases the filter response transition slope between pass-band and stop-band regions.

28. The user interface control apparatus as set fourth in claim 27, wherein the bottom key decreases the filter response pass-band amplitude at a slow rate, the bottom key and the center key operate together to simultaneously decrease the filter response pass-band amplitude at a fast rate, the top key increases the filter response pass-band amplitude at a slow rate, and the top key and the center key operate together to simultaneously increase the filter response pass-band amplitude at a fast rate.

29. The user interface control apparatus as set fourth in claim 25 further comprising means for controlling the comer frequencies of two adjacent pass-band filters including a frequency-dividing crossover network and means for simultaneously controlling both filters so that the difference between the two corner frequencies remains constant, as measured in frequency octaves or decades, said control means operable by depressing the left key and the center key simultaneously to decrease the corner frequencies of both pass-band filters, and depressing the right key and the center key simultaneously increases the comer frequencies of both pass-band filters.

* * * * *